US011268981B2

United States Patent
Treibergs et al.

(10) Patent No.: US 11,268,981 B2
(45) Date of Patent: Mar. 8, 2022

(54) SPRING-LOADED PROBE HAVING FOLDED PORTIONS AND PROBE ASSEMBLY

(71) Applicant: XCERRA CORPORATION, Norwood, MA (US)

(72) Inventors: Valts Treibergs, White Bear Township, MN (US); James Brandes, Robbinsdale, MN (US); Travis Evans, Roseville, MN (US)

(73) Assignee: XCERRA CORPORATION, Norwood, MA (US)

( * ) Notice: Subject to any disclaimer, the term of this patent is extended or adjusted under 35 U.S.C. 154(b) by 92 days.

(21) Appl. No.: 16/466,217

(22) PCT Filed: Dec. 14, 2017

(86) PCT No.: PCT/US2017/066343
§ 371 (c)(1),
(2) Date: Jun. 3, 2019

(87) PCT Pub. No.: WO2018/112166
PCT Pub. Date: Jun. 21, 2018

(65) Prior Publication Data
US 2020/0064373 A1    Feb. 27, 2020

Related U.S. Application Data

(60) Provisional application No. 62/435,366, filed on Dec. 16, 2016.

(51) Int. Cl.
*G01R 1/067* (2006.01)
*G01R 31/28* (2006.01)

(52) U.S. Cl.
CPC ..... *G01R 1/06722* (2013.01); *G01R 31/2853* (2013.01); *H01R 2201/20* (2013.01)

(58) Field of Classification Search
CPC ........... G01R 1/06722; G01R 31/2853; H01R 2201/20; H01R 13/2428
See application file for complete search history.

(56) References Cited

U.S. PATENT DOCUMENTS 4,734,046 A * 3/1988 McAllister ............. G01R 1/073
439/101
6,402,567 B1 * 6/2002 Zhu ..................... H01R 13/2428
439/66

(Continued)

FOREIGN PATENT DOCUMENTS

EP    2599166 A1    6/2013
EP    2747209 A1    6/2014

(Continued)

OTHER PUBLICATIONS

Patent Cooperation Treaty, International Searching Authority, Search Report and Written Opinion for PCT/US2017/066343, 13 pages, dated Mar. 13, 2018.

*Primary Examiner* — Dominic E Hawkins
(74) *Attorney, Agent, or Firm* — Viksnins Harris Padys Malen LLP

(57) ABSTRACT

A test probe for use with a testing apparatus. The test probe includes a first portion, a second portion, and a third portion, with hinges between the first and second portions and the second and third portions. The first portion folded at the first hinge over the second portion, the third portion folded at the second hinge over the second portion, where the second portion is stacked between the first portion and the third portion. The test probe is compressible from a first uncompressed state to a second compressed state.

30 Claims, 10 Drawing Sheets

(56) References Cited

U.S. PATENT DOCUMENTS

| | | | |
|---|---|---|---|
| 7,322,834 B2* | 1/2008 | Hu | H01R 13/2428 439/700 |
| 9,726,692 B2* | 8/2017 | Sakai | G01R 1/06722 |
| 2009/0111289 A1 | 4/2009 | Vinther | |
| 2010/0029100 A1* | 2/2010 | Ichimura | H01R 13/2428 439/66 |
| 2010/0244875 A1* | 9/2010 | Chabineau-Lovgren | H01R 12/714 324/755.11 |
| 2012/0187971 A1 | 7/2012 | Huang | |
| 2014/0327461 A1 | 11/2014 | Zhang et al. | |
| 2016/0226175 A1* | 8/2016 | Chen | H01R 13/2428 |
| 2017/0108535 A1* | 4/2017 | Liu | G01R 31/2887 |

FOREIGN PATENT DOCUMENTS

| | | |
|---|---|---|
| JP | 2001324515 A | 11/2001 |
| WO | 2008147084 A1 | 12/2008 |

* cited by examiner

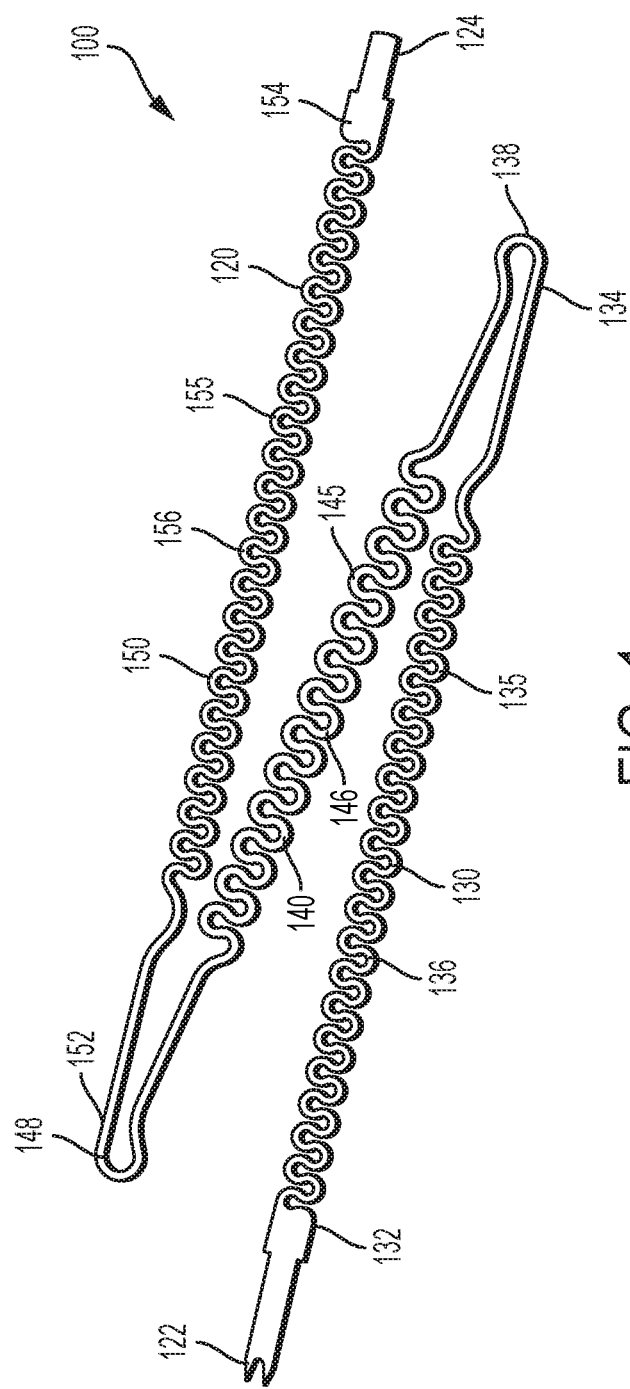
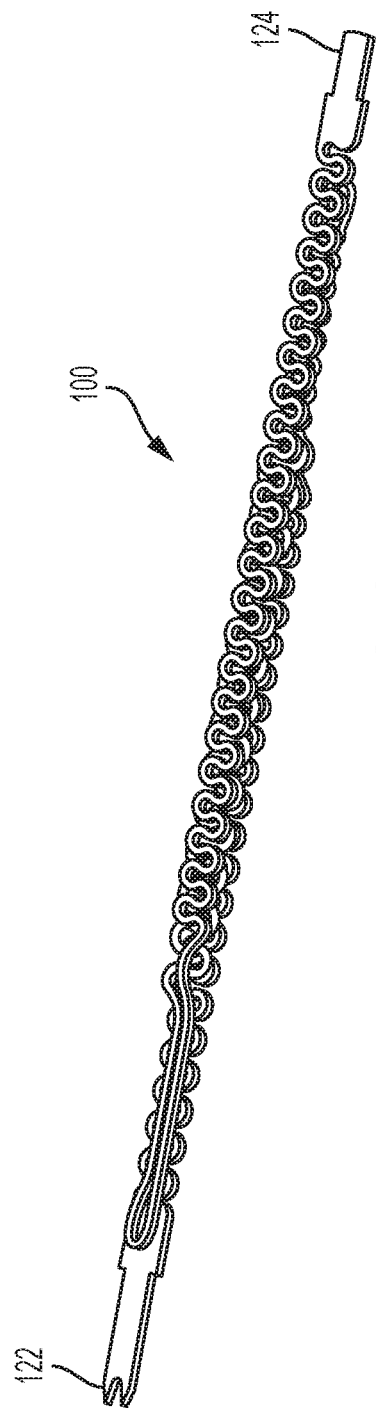

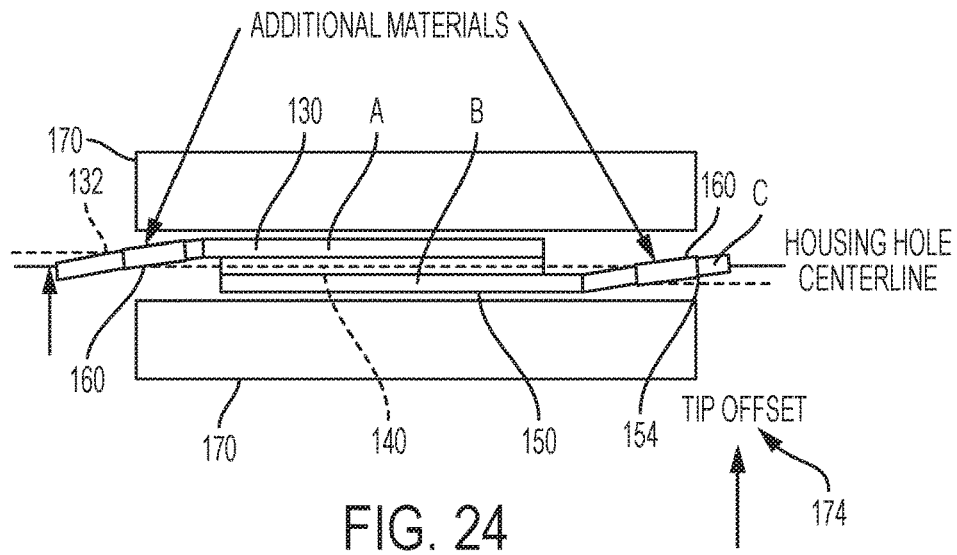
FIG. 24
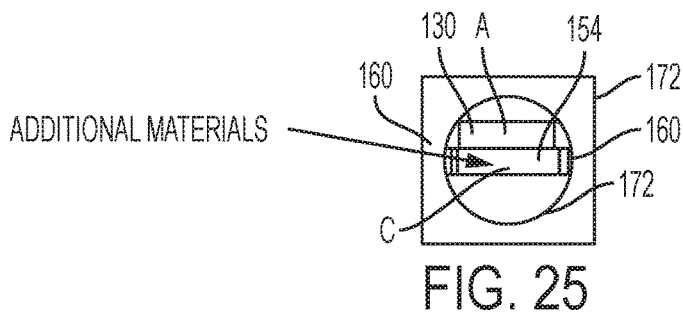
FIG. 25
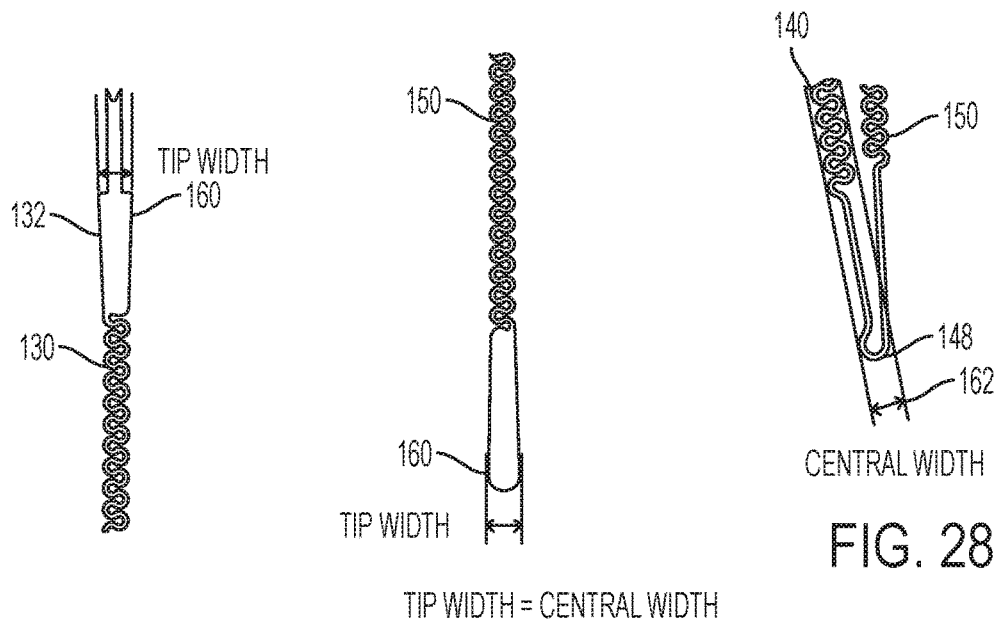
FIG. 26
FIG. 27
FIG. 28

SPRING-LOADED PROBE HAVING FOLDED PORTIONS AND PROBE ASSEMBLY

PRIORITY APPLICATION

This application claims priority to U.S. Provisional Application No. 62/435,366 which was filed on Dec. 16, 2016. The entire content of the application referenced above is hereby incorporated by reference herein.

TECHNICAL FIELD

Spring contact assemblies and assemblies useful for test probes and related methods.

TECHNICAL BACKGROUND

Integrated Circuits (ICs) are increasingly packaged at the wafer level. These Wafer-Level Chip Scale Packages (WLCSPs) offer several advantages in terms of improved electrical performance, small finished package size, and economical manufacturing. In order to take full advantage of the economical packaging aspect, these devices are also tested at the wafer level.

As WLCSPs get smaller in size, the pitch between contact points is also shrinking. For example, 0.4 mm pitch is moving to 0.3 mm, with demand for 0.2 and smaller growing. Traditional wafer probe technologies can handle the finer pitch, but are not suitable for the higher electrical performance required for Wafer-Level Test (WLT) which is the final test.

WLT requires high bandwidth for at-speed testing of RF device, low inductance for clean power delivery, and high current carrying capacity for some DC parametric tests.

SUMMARY

A test probe for use with a testing apparatus. The test probe includes a first portion, a second portion, and a third portion, with hinges between the first and second portions and the second and third portions. The first portion folded at the first hinge over the second portion, the third portion folded at the second hinge over the second portion, where the second portion is stacked between the first portion and the third portion. The test probe is compressible from a first uncompressed state to a second compressed state.

In one or more embodiments, the first hinge is a first loop.

In one or more embodiments, the second hinge is a second loop.

In one or more embodiments, the second loop is bent toward the first portion and provides for redundant electrical current flow.

In one or more embodiments, at least one of the first portion, the second portion, or the third portion includes a spring.

In one or more embodiments, the first portion includes a sinuous flat compression spring.

In one or more embodiments, the second portion includes sinuous flat extension spring.

In one or more embodiments, the third portion includes a sinuous flat compression spring.

In one or more embodiments, the first portion includes a sinuous compression spring, the second portion includes sinuous extension spring, and the third portion includes a sinuous compression spring.

In one or more embodiments, the second portion is a non-deflecting solid portion, and the first and third portions comprise compression springs.

In one or more embodiments, the second portion comprises an extension spring, and the first and third portions comprising non-deflecting solid portions.

In one or more embodiments, a testing apparatus includes a housing, at least one test probe extending from a first end to a second end, and the at least one test probe is disposed within the housing. The test probe includes a first portion extending between a first portion first end and a first portion second end and has a first portion intermediate portion therebetween. The test probe includes a second portion extending between a second portion first end and a second portion second end and has a second portion intermediate portion therebetween. The test probe further includes a third portion extending between a third portion first end and a third portion second end and has a third portion intermediate portion therebetween, where the second portion is disposed between the first portion and the third portion.

The test probe further includes a first hinge connecting the first portion with the second portion, and a second hinge connecting the second portion with the third portion. The first portion of the test probe is folded at the first hinge over the second portion, and the third portion is folded at the second hinge over the second portion, and the test probe is compressible from a first uncompressed state to a second compressed state.

In one or more embodiments, the first hinge is a first loop.

In one or more embodiments, the second hinge is a second loop.

In one or more embodiments, the second loop is bent toward the first portion and provides for redundant electrical current flow.

In one or more embodiments, at least one of the first portion, the second portion, or the third portion includes a spring.

In one or more embodiments, the first portion includes a sinuous flat compression spring.

In one or more embodiments, the second portion includes sinuous flat extension spring.

In one or more embodiments, the third portion includes a sinuous flat compression spring.

In one or more embodiments, the testing apparatus includes two or more probes, wherein the first portion first end of at least two probes are offset from each other.

In one or more embodiments, the housing is a metal tube.

In one or more embodiments, wherein the housing is a metal tube with closed ends and having an opening for the first and second ends.

In one or more embodiments, the third portion includes a sinuous flat compression spring.

In one or more embodiments, the first portion includes a sinuous compression spring, the second portion includes sinuous extension spring, and the third portion includes a sinuous compression spring.

In one or more embodiments, the second portion is a non-deflecting solid portion, and the first and third portions comprise springs.

In one or more embodiments, the second portion comprises a spring, and the first and third portions comprising non-deflecting solid portions.

These and other embodiments, aspects, advantages, and features of the present invention will be set forth in part in the description which follows, and will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

BRIEF DESCRIPTION OF THE FIGURES

FIG. 1 is a perspective view of an unassembled test probe according to one or more embodiments.

FIG. 2 is a perspective view of an assembled test probe according to one or more embodiments.

FIG. 24 is a side view of a test probe within a housing according to one or more embodiments.

FIG. 25 is an end view of FIG. 24 according to one or more embodiments.

FIG. 26 is a side view of a first portion of a test probe according to one or more embodiments.

FIG. 27 is a side view of a third portion of a test probe according to one or more embodiments.

FIG. 28 is a side view of an intermediate portion of a test probe according to one or more embodiments.

DETAILED DESCRIPTION

The following detailed description includes references to the accompanying drawings, which form a part of the detailed description. The drawings show, by way of illustration, specific embodiments in which the apparatus may be practiced. These embodiments, which are also referred to herein as "examples" or "options," are described in enough detail to enable those skilled in the art to practice the present embodiments. The embodiments may be combined, other embodiments may be utilized or structural or logical changes may be made without departing from the scope of the invention. The following detailed description is, therefore, not to be taken in a limiting sense and the scope of the invention is defined by the appended claims and their legal equivalents.

In this document, the terms "a" or "an" are used to include one or more than one, and the term "or" is used to refer to a nonexclusive "or" unless otherwise indicated. In addition, it is to be understood that the phraseology or terminology employed herein, and not otherwise defined, is for the purpose of description only and not of limitation.

Figure 3:
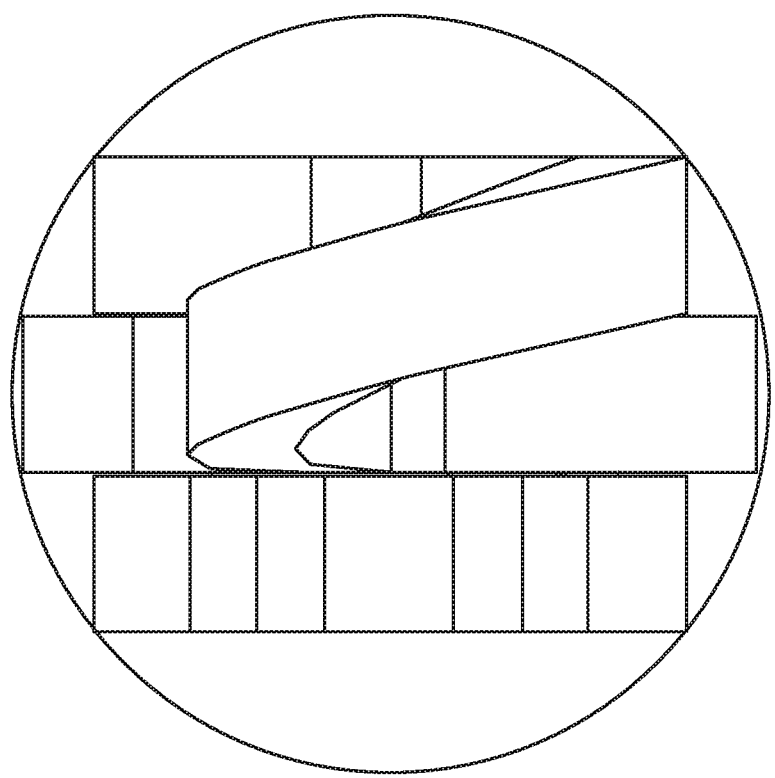
FIG. 3 is a top view of a test probe within a socket hole according to one or more embodiments.
Figure 4:
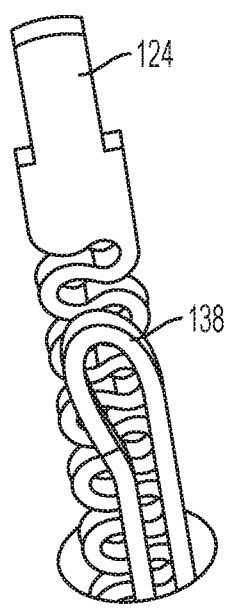
FIG. 4 is a perspective view of a test probe within a socket hole according to one or more embodiments.

A testing apparatus 100 having a test probe 120 with improved biasing and retention is described herein. The probe 120 can be disposed in a testing apparatus housing 170 such as a plastic housing, as shown in FIG. 4. The test probe 120 includes a first portion 130, a second portion 140, and a third portion 150, with hinges between the first and second portions and the second and third portions. The first portion 130 is folded at a first hinge 138 over the second portion 140, the third portion 150 folded at a second hinge 148 over the second portion 140, where the second portion 140 is disposed between the first portion 130 and the third portion 150, such that the first portion 130, the second portion 140, and the third portion 150 are stacked on top of each other. The test probe 120 is compressible from a first uncompressed state to a second compressed state.

FIGS. 1-6 illustrate the test probe 120 in greater detail. The test probe 120 extends from a first end 122 to a second end 124, and includes folded portions therebetween. For example, three individual portions are folded over one another at hinges to form the test probe, where FIG. 1 illustrates an example of a test probe in an unformed state (ie prior to folding). The first end 122 has a tip that is used to electrically connect with and interface with an IC device under test, for example solder ball or pad. The second end 124 is used to electrically connect with solderless printed circuit board pad. The first and second ends 122, 124 can have geometry suitable to ensure or enhance electrical connectivity between the test probe and the IC device under test/pcb pad. In one or more embodiments, the test probe 120 has a rectangular cross-section.

The test probe 120 includes a first portion 130 extending between a first portion first end 132 and a first portion second end 134 and having a first portion intermediate portion 136 therebetween. In one or more embodiments, the first portion intermediate portion 136 includes, but is not limited to, a spring 135, such as a sinuous flat compression spring.

The test probe 120 includes a second portion 140 extending between a second portion first end 142 and a second portion second end 144 and having a second portion intermediate portion 146 therebetween. In one or more embodiments, the second portion intermediate portion 146 includes, but is not limited to, a spring 145, such as a sinuous flat extension spring.

The test probe 120 further includes a third portion 150 extending between a third portion first end 152 and a third portion second end 154 and having a third portion intermediate portion 156 therebetween. In one or more embodiments, the first portion intermediate portion 156 includes, but is not limited to, a spring 155, such as a sinuous flat compression spring. When in the formed state, as shown in FIG. 2, the second portion 140 is disposed between the first portion 130 and the third portion 150.

Figure 5:
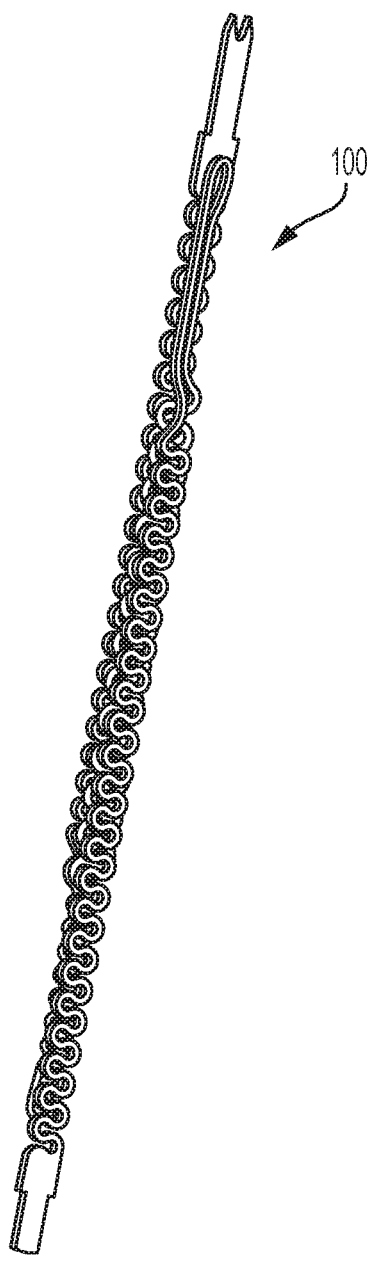
FIG. 5 is a perspective view of a test probe in an uncompressed state according to one or more embodiments.
Figure 6:
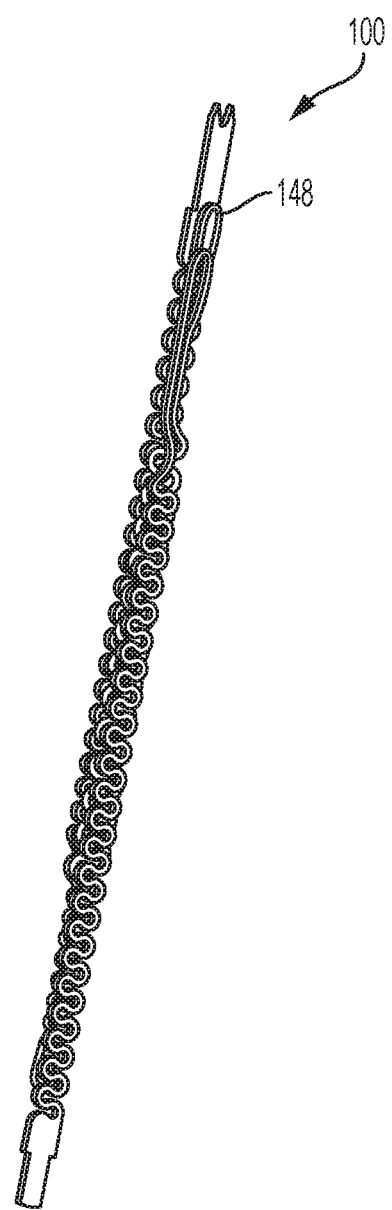
FIG. 6 is a perspective view of a test probe in a compressed state according to one or more embodiments.
Figure 11:
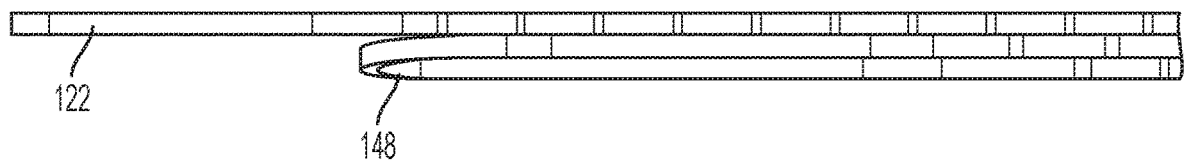
FIG. 11 is a side view of a portion of a test probe in an uncompressed position according to one or more embodiments.
Figure 12:
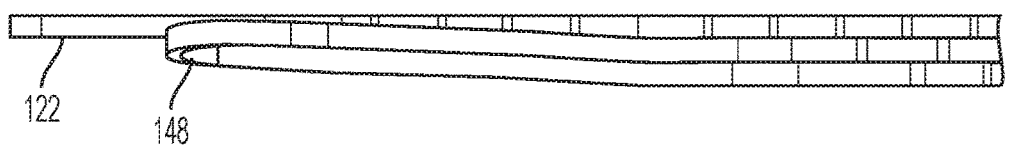
FIG. 12 is a first side view of a test probe assembly in a compressed position according to one or more embodiments.
Figure 13:
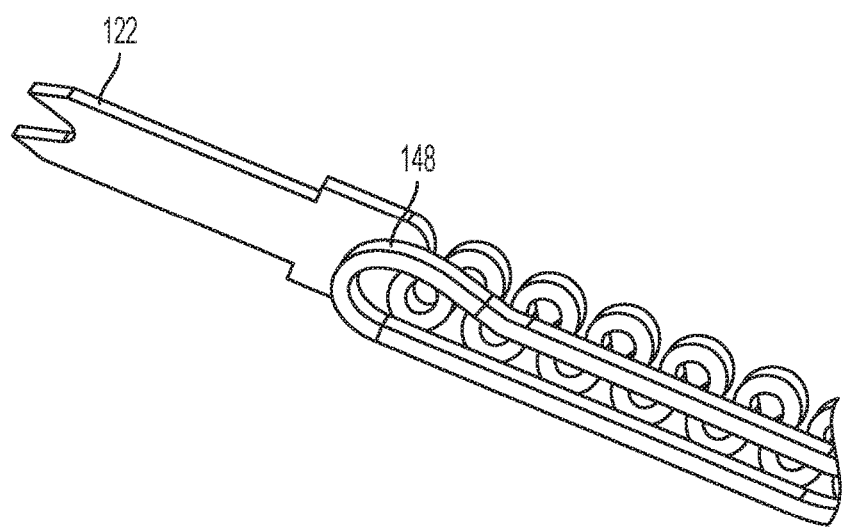
FIG. 13 is an enlarged perspective view of a test probe according to one or more embodiments.

A first hinge 138 is disposed between and connects the first portion 130 with the second portion 140. In one or more embodiments, the first hinge 138 forms a first loop. In one or more embodiments, the first loop includes a hairpin-shaped structure. A second hinge 148 is disposed between and connects the second portion 140 with the third portion 150. In one or more embodiments, the second hinge 148 forms a second loop. In one or more embodiments, the second loop includes a hairpin-shaped structure. In one or more embodiments, the first portion folded at the first hinge over the second portion, as shown in FIG. 2. In one or more embodiments, the folding operation is conducted by permanently deforming or pinching the loops. In one or more embodiments, the third portion is folded at the second hinge over the second portion. In one or more embodiments, the test probe is compressible from a first uncompressed state, as shown in FIG. 5, to a second compressed state, as shown in FIG. 6. As can be seen in FIGS. 11 (uncompressed state) and 12 (compressed state), the second hinge 148 biases toward the first portion 130 when the probe is placed in the compressed state, which provides for redundant electrical contact reliability.

Figure 7:
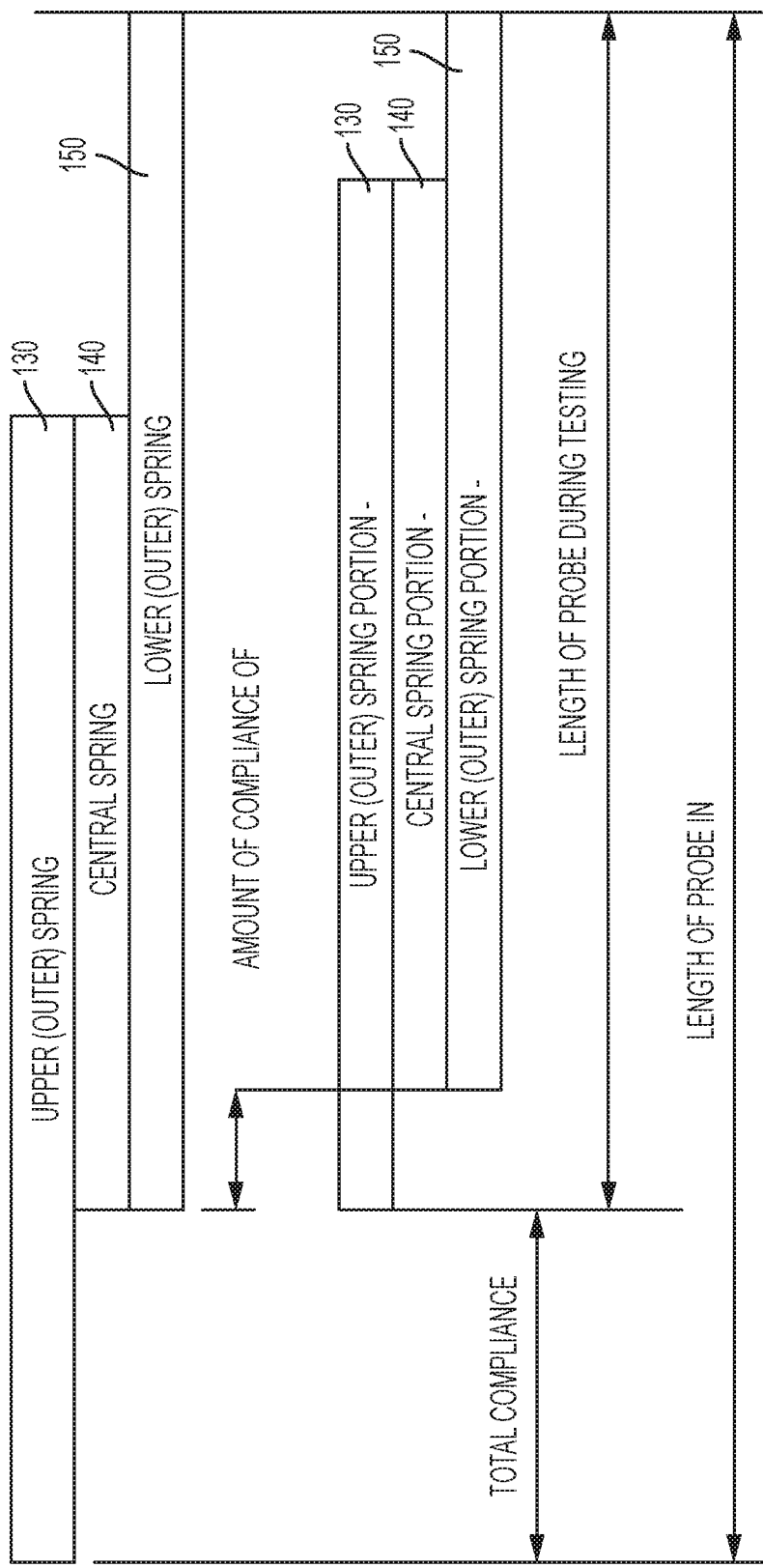
FIG. 7 is a functional block diagram of a test probe according to one or more embodiments illustrating the test probe in an uncompressed and compressed state.

FIG. 7 illustrates a functional diagram of the test probe in use. The total probe compliance is a sum of compression of the first portion 130 (upper portion) plus extension of the second portion 140 (central portion) plus compression of the third portion 150 (lower portion).

Figure 8:
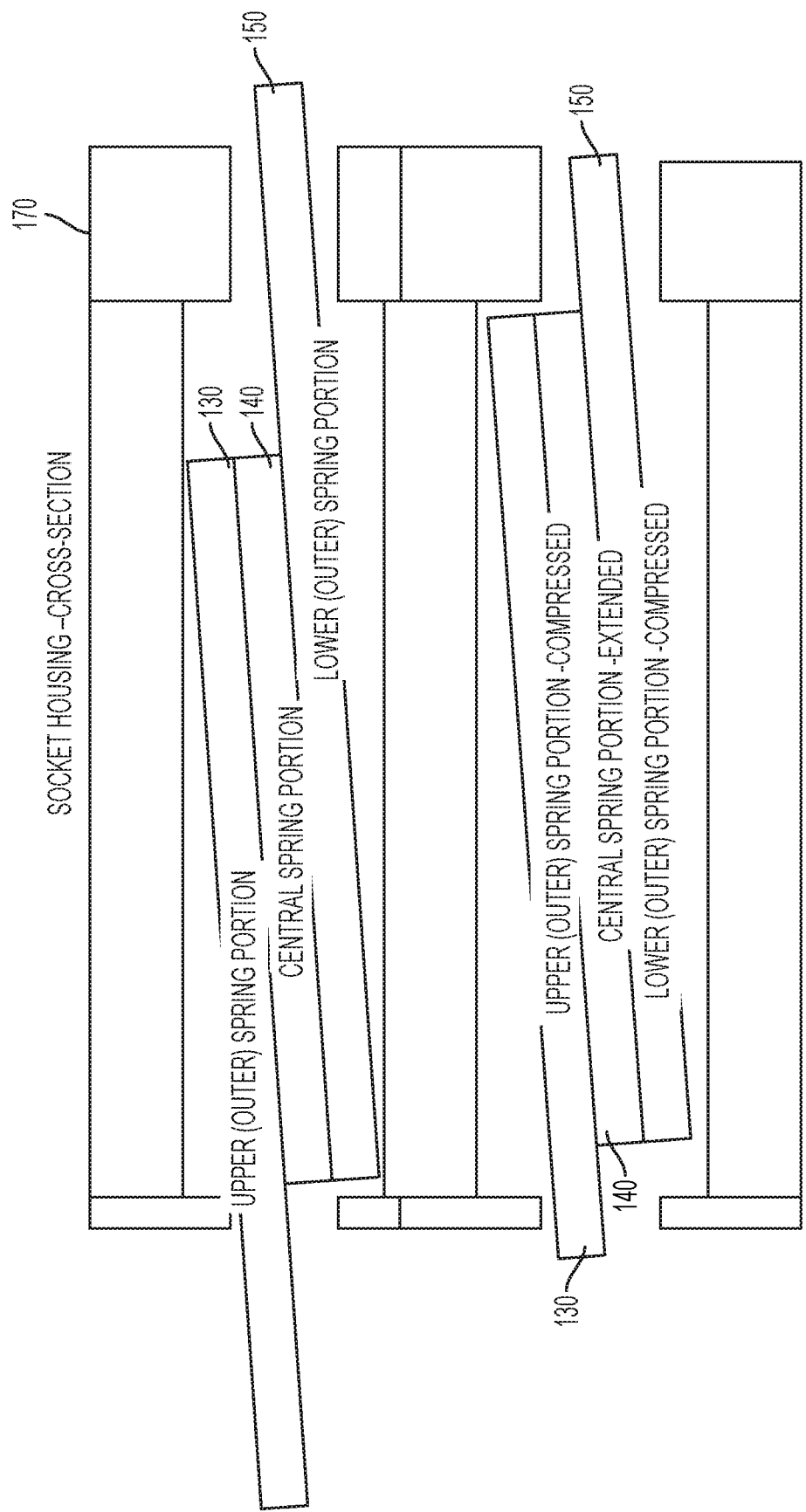
FIG. 8 is a block diagram of a test probe assembly according to one or more embodiments within a socket housing shown in an uncompressed and compressed state.

FIG. 8 illustrates a function diagram of the test probe in use within a socket housing 170. The test probe can be aligned with the housing such that a longitudinal axis of the probe is parallel with a longitudinal axis of the socket. In one or more embodiments, the probe is not parallel and is slightly offset, as shown in FIG. 8, which shows the probe in a compressed and uncompressed state.

Figure 9:
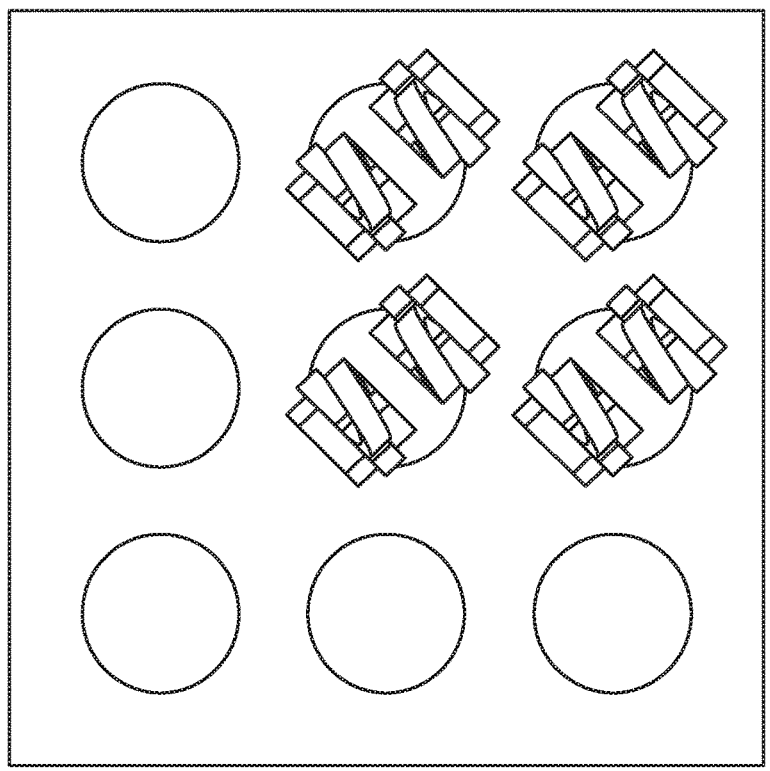
FIG. 9 is a testing configuration of a test probe assembly according to one or more embodiments illustrating pairs of test probes engaging a BGA device in a Kelvin configuration.
Figure 10:
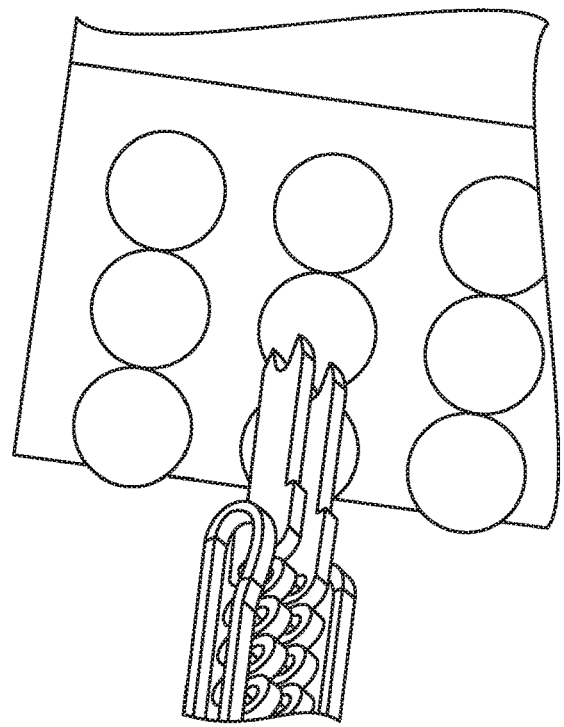
FIG. 10 is a testing configuration of a portion of a test probe assembly according to one or more embodiments illustrating pairs of test probes engaging a BGA device in a Kelvin configuration.

FIGS. 9 and 10 illustrate the probe having an application to IC testing. In one or more embodiments, a single probe can make contact with a single device under test (DUT) solder ball. The one or more probes can also be situated with offsets to create a Kelvin arrangement with two probes per solder ball, as shown in FIG. 9. This provides force/sensing capability for more accurate DC parametric measurements.

Figure 14:
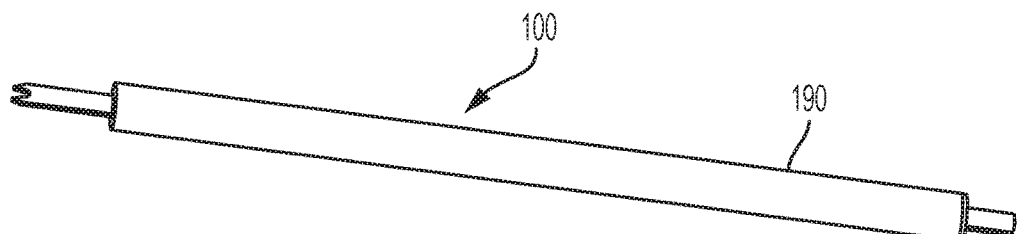
FIG. 14 is a side view of a test probe assembly in an uncompressed position according to one or more embodiments.
Figure 15:
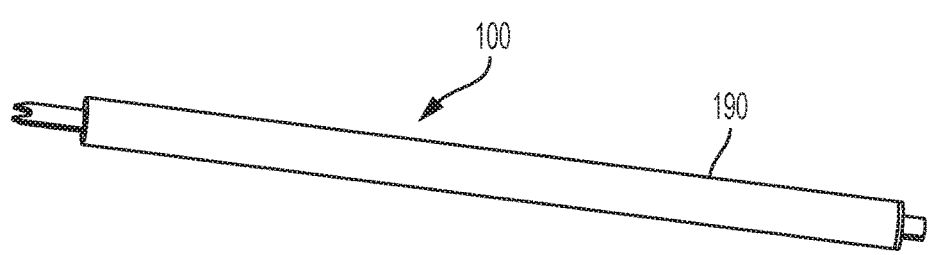
FIG. 15 is a side view of a test probe assembly in a compressed position according to one or more embodiments.
Figure 16:
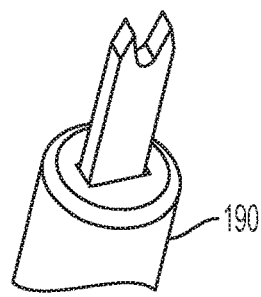
FIG. 16 is an enlarged perspective view of the test probe assembly according to one or more embodiments.
Figure 17:
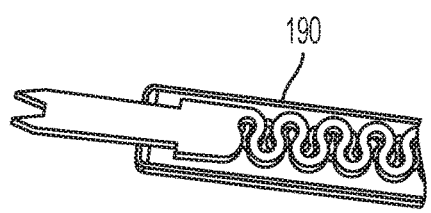
FIG. 17 is an enlarged cross sectional view of the test probe assembly of FIG. 16.
Figure 18:
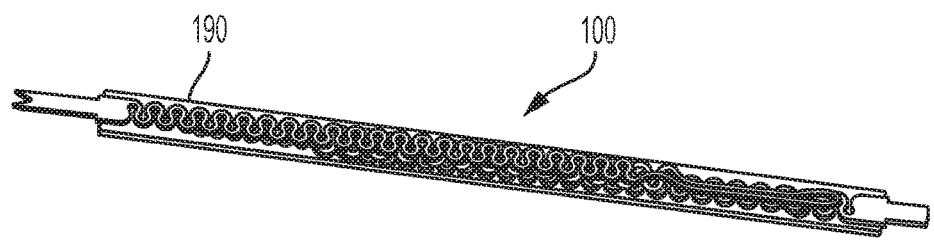
FIG. 18 is a cross sectional view of the test probe assembly of FIG. 14.
Figure 19:
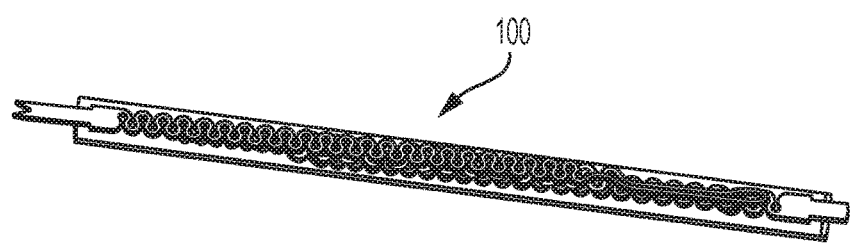
FIG. 19 is a cross sectional view of the test probe assembly of FIG. 15.

FIGS. 14-19 illustrate another embodiment of the test probe assembly. The assembly, in one or more embodiments, includes the test probe disposed within a tube 190, such as a metal tube with, for example closed ends. The metal tube allows for easier handling of the probe, and provides secondary conductive path to lower contact resistance, increase conductance, and minimizes RF signal discontinuities. FIGS. 14, 18 illustrate the assembly with a probe in an uncompressed state. FIGS. 15, 19 illustrate the assembly with a probe in a compressed state.

Figure 20:
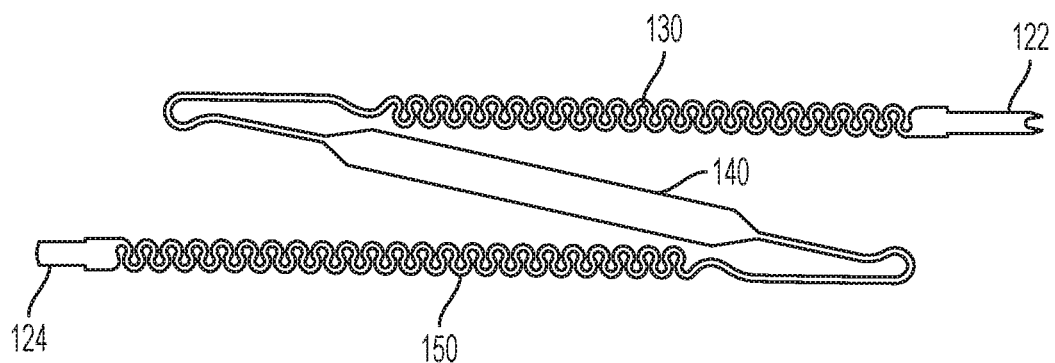
FIG. 20 is a side view of an unassembled test probe according to one or more embodiments.
Figure 21:
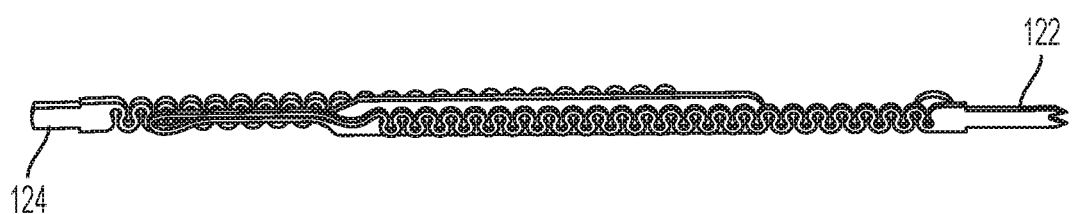
FIG. 21 is a perspective view of an assembled test probe according to one or more embodiments.

FIGS. 20, 21 illustrate another embodiment of the test probe assembly. The assembly, in one or more embodiments, includes a test probe that has a second portion 140 that has a solid, non-deflecting portion, and the first and third portions 130, 150 has springs as discussed above. The additional metal mass in the probe will increase the overall conductance. There will be a slight reduction in overall spring compliance.

Figure 22:
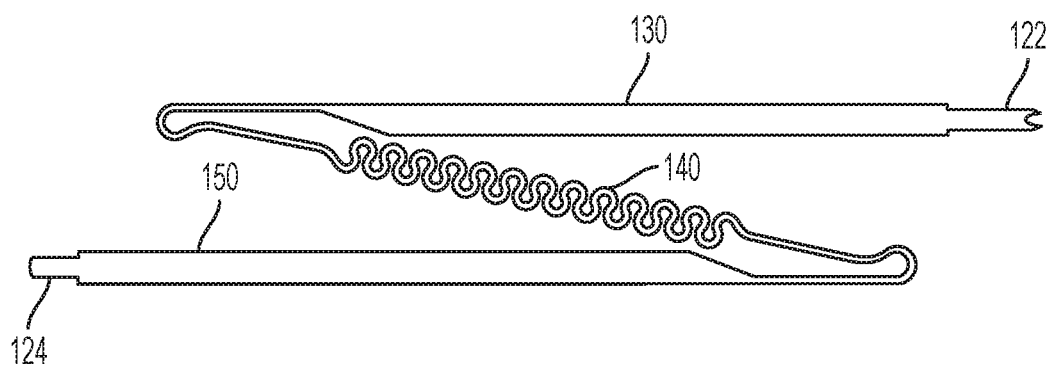
FIG. 22 is a side view of an unassembled test probe according to one or more embodiments.
Figure 23:
FIG. 23 is a perspective view of an assembled test probe according to one or more embodiments.

FIGS. 22, 23 illustrate another embodiment of the test probe assembly. The assembly, in one or more embodiments, includes first and third portions 130, 150 that have solid, non-deflecting portions. The second portion 140 includes a spring. The additional metal mass in the probe will increase the overall conductance. There will be a slight reduction in overall spring compliance.

FIGS. 24-28 illustrate another embodiment of the test probe assembly. The assembly includes a first portion 130 having a first portion first end 132, a second portion 140, a third portion 150, and a third portion second end 154, as discussed above. The test probe assembly is disposed in a housing hole 172 of a housing 170. In one or more embodiments, the first portion first end 132 and/or or the third portion second end 154 include an offset member 160 that allows for the end portions 132, 154 to be aligned with the housing hole centerline 174, as shown in FIG. 25.

The offset member 160 can be integral with the end portions 132, 154 or can be separate, for example, sleeves of material. In one or more embodiments, the offset member 160 has a width that is substantially similar to a housing hole diameter. In one or more embodiments, the second portion 140 is defined by a width 162 (FIG. 28), and the width 162 is wider that the first portion 130. In one or more embodiments, a width of the end portions 132, 154 are substantially the same as the width 162. The offset member 160 allows for the end portions 132, 154 to be biased toward the housing hole centerline 174 using the diameter of the housing hole 172. The overall flexibility and resiliency of the assembly allows for this biasing without performance degradation. In addition, the biasing of the end portions 132, 154 toward the centerline 174 further improves the rubbing of components for redundant electrical current flow, and superior performance, as well as providing improved contact tip centering with respect to the housing hole.

A method includes using the various test probe assemblies, for example, within a testing apparatus. The method further or alternatively includes assembling a testing apparatus including the test probe assemblies discussed above.

The probe can be manufactured using material removal processes, such as, but not limited to stamping, chemical etching, water jet cutting, or wire EDM machining. Other options include additive manufacturing processes, such as, but not limited to, 3D printing, wafer lithography, or electroforming. The test probe is made from an electrically conductive material, such as metal, with high hardness, resiliency, and strength. The test probe can also be coated, for example by electroplating, on exterior surfaces to enhance electrical reliability and to prevent corrosion.

The geometry of the test probe assembly allows for ease of assembly, and an indication to the user of the proper orientation of the assembly. The one piece construction allows for economical assembly and minimal electrical noise from sliding contacts. The short overall length provides for low inductance, high bandwidth, and high current carrying capability. In addition, the test probe allows for improved mechanical performance, where three springs in series for mechanical compliance and force. The tips, such as sharp tines, provide pressure at the DUT contact point.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present application. The scope should, therefore, be determined with reference to the appended claims, along with the full scope of equivalents to which such claims are entitled.

The invention claimed is:

1. A test probe for use with a testing apparatus comprising:
the test probe extending from a first end to a second end;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the test probe having a formed state, the formed state having the first portion folded at the first hinge over the second portion, the first portion aligned substantially parallel to the second portion, and the third portion folded at the second hinge over the second portion, the second portion aligned substantially parallel to the third portion; and
the test probe is compressible from a first uncompressed state to a second compressed state.

2. The test probe as recited in claim 1, wherein at least one of the first portion, the second portion, or the third portion includes a spring.

3. The test probe as recited in claim 1, wherein the first portion includes a sinuous flat compression spring.

4. The test probe as recited in claim 1, wherein the second portion includes sinuous flat extension spring.

5. The test probe as recited in claim 1, wherein the third portion includes a sinuous flat compression spring.

6. The test probe as recited in claim 1, wherein the first portion includes a sinuous compression spring, the second portion includes sinuous extension spring, and the third portion includes a sinuous compression spring.

7. The test probe as recited in claim 1, wherein the second portion is a non-deflecting solid portion, and the first and third portions comprise springs.

8. The test probe of claim 1, wherein in the folded state the first portion is in contact with the second portion and the second portion is in contact with the third portion.

9. A test probe for use with a testing apparatus comprising:
the test probe extending from a first end to a second end;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the first portion folded at the first hinge over the second portion;
the third portion folded at the second hinge over the second portion; and
the test probe is compressible from a first uncompressed state to a second compressed state, wherein the first hinge is a first loop, the first loop permanently deformed with the probe in the formed state.

10. A test probe for use with a testing apparatus comprising:
the test probe extending from a first end to a second end;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the first portion folded at the first hinge over the second portion;
the third portion folded at the second hinge over the second portion; and
the test probe is compressible from a first uncompressed state to a second compressed state, wherein the second hinge is a second loop, the second loop permanently deformed with the probe in the formed state.

11. The test probe as recited in claim 10, wherein the second loop is bent toward the first portion and provides for redundant electrical current flow.

12. A test probe for use with a testing apparatus comprising:
the test probe extending from a first end to a second end;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the first portion folded at the first hinge over the second portion;
the third portion folded at the second hinge over the second portion; and
the test probe is compressible from a first uncompressed state to a second compressed state, wherein the second portion comprises a spring, and the first and third portions comprising non-deflecting solid portions.

13. A testing apparatus comprising:
a housing;
at least one test probe extending from a first end to a second end, the at least one test probe disposed within the housing;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the test probe having a formed state, the formed state having the first portion folded at the first hinge over the second portion, the first portion aligned substantially parallel to the second portion, and the third portion folded at the second hinge over the second portion, the second portion aligned substantially parallel to the third portion; and
the test probe is compressible from a first uncompressed state to a second compressed state.

14. The testing apparatus as recited in claim 13, wherein at least one of the first portion, the second portion, or the third portion includes a spring.

15. The testing apparatus as recited in claim 13, wherein the first portion includes a sinuous flat compression spring.

16. The testing apparatus as recited in claim 13, wherein the second portion includes sinuous flat extension spring.

17. The testing apparatus as recited in claim 13, wherein the third portion includes a sinuous flat compression spring.

18. The testing apparatus as recited in claim 13, wherein the testing apparatus includes two or more probes, wherein the first portion first end of at least two probes are offset from each other.

19. The testing apparatus as recited in claim 13, wherein the housing is a metal tube with closed ends and having an opening for the first and second ends.

20. The testing apparatus as recited in claim 13, wherein the third portion includes a sinuous flat compression spring.

21. The testing apparatus as recited in claim 13, wherein the first portion includes a sinuous compression spring, the second portion includes sinuous extension spring, and the third portion includes a sinuous compression spring.

22. The testing apparatus as recited in claim 13, wherein the second portion is a non-deflecting solid portion, and the first and third portions comprise springs.

23. A testing apparatus comprising:
a housing;
at least one test probe extending from a first end to a second end, the at least one test probe disposed within the housing;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the first portion folded at the first hinge over the second portion;
the third portion folded at the second hinge over the second portion; and
the test probe is compressible from a first uncompressed state to a second compressed state, wherein the first hinge is a first loop, the first loop permanently deformed with the probe in the formed state.

24. A testing apparatus comprising:
a housing;
at least one test probe extending from a first end to a second end, the at least one test probe disposed within the housing;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the first portion folded at the first hinge over the second portion;
the third portion folded at the second hinge over the second portion; and
the test probe is compressible from a first uncompressed state to a second compressed state, wherein the second hinge is a second loop, the second loop permanently deformed with the probe in the formed state.

25. The testing apparatus as recited in claim 24, wherein the second loop is bent toward the first portion and provides for redundant electrical current flow.

26. A testing apparatus comprising:
a housing;
at least one test probe extending from a first end to a second end, the at least one test probe disposed within the housing;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the first portion folded at the first hinge over the second portion;
the third portion folded at the second hinge over the second portion; and
the test probe is compressible from a first uncompressed state to a second compressed state, wherein the housing is a metal tube.

27. A test probe for use with a testing apparatus comprising:
the test probe extending from a first end to a second end;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the first portion folded at the first hinge over the second portion;
the third portion folded at the second hinge over the second portion; and
the test probe is compressible from a first uncompressed state to a second compressed state, wherein the second portion comprises a spring, and the first and third portions comprising non-deflecting solid portions.

28. A testing apparatus comprising:
a housing;
at least one test probe extending from a first end to a second end, the at least one test probe disposed within the housing;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the first portion folded at the first hinge over the second portion;
the third portion folded at the second hinge over the second portion; and
the test probe is compressible from a first uncompressed state to a second compressed state, wherein the housing has a housing hole, the first portion first end having an offset member, the offset member biases the offset member toward a centerline of the housing hole.

29. The testing apparatus as recited in claim 28, wherein the housing has a housing hole, the third portion second end having an offset member, the offset member biases the offset member toward the centerline of the housing hole.

30. A testing apparatus comprising:
a housing;
at least one test probe extending from a first end to a second end, the at least one test probe disposed within the housing;
the test probe including a first portion extending between a first portion first end and a first portion second end and having a first portion intermediate portion therebetween;
the test probe including a second portion extending between a second portion first end and a second portion second end and having a second portion intermediate portion therebetween;
the test probe including a third portion extending between a third portion first end and a third portion second end and having a third portion intermediate portion therebetween, where the second portion is disposed between the first portion and the third portion;
a first hinge connecting the first portion with the second portion;
a second hinge connecting the second portion with the third portion;
the first portion folded at the first hinge over the second portion;
the third portion folded at the second hinge over the second portion; and
the test probe is compressible from a first uncompressed state to a second compressed state, wherein the housing has a housing hole, the first portion first end having an offset member, the second portion having a second portion width, the offset member having a width substantially similar to the second portion width, the offset member biases the offset member toward a centerline of the housing hole.

* * * * *